United States Patent [19]

Hazama et al.

[11] 4,223,285
[45] Sep. 16, 1980

[54] ELASTIC SURFACE WAVE FILTER

[75] Inventors: Katashi Hazama; Jun Yamada, both of Yokohama; Yoshihiko Noro, Kamakura, all of Japan

[73] Assignee: Hitachi, Ltd., Japan

[21] Appl. No.: 857,908

[22] Filed: Dec. 6, 1977

[30] Foreign Application Priority Data

Dec. 8, 1976 [JP] Japan .................. 51-146504

[51] Int. Cl.$^2$ .............. H03H 9/04; H03H 9/26; H03H 9/32
[52] U.S. Cl. .................. 333/194; 333/196; 358/40
[58] Field of Search ............ 333/30 R, 72, 150–155, 333/193–196; 364/821; 358/5, 21, 37–39, 167, 904, 905, 40, 31; 331/107 A; 310/313

[56] References Cited

U.S. PATENT DOCUMENTS

| 3,633,132 | 1/1972 | Hartemann | 333/30 R |
| 3,675,163 | 7/1972 | Hartmann et al. | 333/30 R |
| 4,030,050 | 6/1977 | Deacon et al. | 333/72 |
| 4,047,130 | 9/1977 | Lim et al. | 333/72 |
| 4,066,985 | 1/1978 | Kuny | 333/72 |

OTHER PUBLICATIONS

Hartemann et al—"Intrinsic Compensation of Sidelobes in a Dispersive Acoustic Delay Line" in Electronics Letters 15 May 1969; pp. 219–220.
Chauvin et al.—"Acoustic-Surface-Wave Television Filters" in Electronics Letters 26 Aug. 1971; pp. 491–492.
Hartmann et al.—"Impulse Model Design of Acoustic Surface-Wave Filters" in IEEE Trans on Microwave Theory and Techniques MTT 21 Apr. 1973; pp. 162–175.
Moulding et al.—"A Technique for Saw Bandpass Filter Design", 1974 Ultrasonic Symposium Proceeding, IEEE Cat. #74 CHO 896-1SU; pp. 168–171.

Primary Examiner—Alfred E. Smith
Assistant Examiner—Marvin Nussbaum
Attorney, Agent, or Firm—Craig & Antonelli

[57] ABSTRACT

An elastic surface wave filter for use as an intermediate frequency filter in a color television receiver, comprising an input electrode provided on a piezoelectric substrate plate for converting an electric signal into elastic surface waves propagating through the surface layer of the piezoelectric substrate plate, a propagation path for the elastic surface waves in the piezoelectric substrate plate and an output electrode for converting the propagated elastic surface wave into an electric signal, wherein the fingers of the input electrode are so arranged that the position at which the overlap of the interleaved fingers is maximum is farther with respect to the output electrode than the middle point along the lengthwise direction of the input electrode and wherein the pitch between the adjacent interleaved fingers is non-uniform on both the sides of the position of the maximum overlap, whereby desired group delay and amplitude characteristics for predetermined frequencies are easily and simultaneously obtained.

10 Claims, 11 Drawing Figures

ELASTIC SURFACE WAVE FILTER

LIST OF PRIOR ART REFERENCES (37 CFR 1.56 (a))

The following references are cited to show the state of the art:
1. 1974 Ultrasonic Symposium Proceedings, IEEE Cat. #74 CHO 986-1SU, pp. 168-171
2. IEEE TRANSACTIONS ON MICROWAVE THEORY AND TECHNIQUE, Vol. MTT-21, No. 4, April 1973, pp. 162-175
3. U.S. Pat. No. 4,030,050, June 14, 1977 (Filed Sept. 25, 1975)
4. ELECTRONICS LETTERS, Aug. 26, 1971, Vol. 7, No. 17, pp. 491-492

This invention relates to an elastic surface wave filter having a group delay characteristic suitable for commercial electronic instruments, especially for intermediate frequency filters used in color television receivers.

The elastic surface wave filter is one of the micro-solid state devices which today's leading research institutes all over the world are striving to bring up to a practical level. It is the foremost target for the technical concentration on the realization of an elastic surface wave device in which the wave characteristic of the elastic surface waves generated in the surface of the piezoelectric substrate is effectively utilized to process electrical signals.

The elastic surface wave filter, as schematically shown in FIG. 1, usually comprises a piezoelectric substrate 1, an input electrode 2 provided on the substrate 1 for converting electrical signals into elastic surface waves, a propagation path 4 for the elastic surface waves and an output electrode 3 for converting the propagated elastic surface waves into corresponding electrical signals. Each of the input and output electrodes 2 and 3 is an interdigital transducer (hereafter referred to simply as IDT) with its comb-shaped members having their fingers 5 and 6 interleaved with each other (FIG. 2 shows a split type). The frequency characteristic of the elastic surface wave filter is largely determined by the geometry of both the IDTs serving as the input and output electrodes 2 and 3. FIG. 2 shows a split type IDT used as the input or output IDT for an elastic surface wave filter, in which each finger of this IDT is bifurcated. This figure is prepared for representing the most important factors, i.e. dimensions, of the geometry of the IDT. The factors are the overlap length (or simply overlap) Wi of the fingers 5 and 6 of the comb-like members and the pitch Pi between the adjacent fingers.

In order to obtain a desired characteristic, the elastic surface wave filter must use a so-called normal type IDT with its geometrical factors Wi and Pi constant as one of the input and output IDTs and an IDT with its factors varied according to a certain rule as the other, as shown in FIG. 3.

The rule mentioned above depends on the procedure where a given frequency domain characteristic is transformed through Fourier transform into a time domain characteristic of the elastic surface wave generated in the surface layer of the piezoelectric substrate 1 and where the time domain characteristic of the elastic surface wave is represented as a train of pulses to be closely associated with the geometry of the IDT. Namely, the train of pulses represents as a model the time domain characteristic of the elastic surface wave having the given frequency domain characteristic as a physical image and the geometry of each IDT can be uniquely determined by transforming the time base of the train of pulses into the positional scale (i.e. through the operation of multiplication by the propagation velocity of the elastic surface wave).

The intervals between the pulses obtained through the operation described above coincide with the pitches Pi of the IDT and the magnitudes or amplitudes of the pulses correspond to the overlaps Wi of the IDT, the magnitudes themselves being proportional to the desired quantities. Accordingly, the absolute values of the overlaps Wi are necessarily converted to the actual dimensions required in design by determining or adjusting the overall impedance in accordance with the uses. Therefore, the characteristic of any IDT can be equivalently given by naming the overlaps Wi and the pitches Pi, without mentioning the actual size and shape of the IDT.

Much is said theoretically and empirically about the amplitude characteristic mentioned in an article in IEEE TRANSACTIONS ON MICROWAVE THEORY AND TECHNIQUE (Vol. MTT-21, No. 4, April 1973, pp. 162-175), entitled "Impulse Model Design of Acoustic Surface-Wave Filters" etc.

However, there is another point, i.e. the relationship between frequency and group delay time (hereafter referred to as group delay characteristic), to be severely checked so as to satisfy the role as a filter. So far as the Inventors' investigation is concerned, this point was in the past discussed only in an article in 1974 Ultrasonic Symposium Proceedings (IEEE Cat. #74 CHO 896-ISU, pp. 168-171), entitled "A TECHNIQUE FOR SAW BANDPASS FILTER DESIGN" (only in a part of the latter half thereof).

FIG. 3 schematically shows in plan a conventional elastic surface wave filter, in which reference numeral 1 indicates a piezoelectric substrate of, for example, lithium niobate (LiNbO₃); 2 an input IDT having split fingers; 3 an output IDT having split fingers; 4 a propagation path for an elastic surface wave; 7a and 7b the electrode terminals of the input IDT 2 for receiving electrical signals; and 8a and 8b the electrode terminals of the output IDT 3 for delivering an output which is obtained by converting the elastic surface wave propagated from the input IDT 2 via the propagation path 4 to the output IDT 3, into an electrical signal by the output IDT 3. The filter shown in FIG. 3 is only schematically drawn and therefore the overlaps Wi of the fingers of the input and output IDTs appear actual while concerning the pitch Pi the fingers 5 and 6 are equidistantly extracted to reveal the detailed structures of the IDTs.

The feature of the structure of the conventional elastic surface wave filter thus shown in FIG. 3 is therefore that the position at which the overlap Wi of the fingers of the output IDT 3 is maximum is at the middle point of the principal portion (except the lead-out conductor to the electrode 8b) of the output IDT 3 in the longitudinal direction of the output IDT 3 and that the pattern of overlaps is symmetrical with respect to the point of maximum overlap. However, the symmetricity is not an essential requirement and the pattern may sometimes by asymmetrical.

In both the cases of symmetrical and asymmetrical overlap patterns, the characteristics required when an elastic surface wave filter is used as an electronic circuit element, includes the group delay characteristic as well as the above mentioned amplitude characteristic.

For example, according to the conventional design procedure described above, the group delay characteristic has a flat response if the overlaps Wi and the pitches Pi vary symmetrically along the direction parallel to the direction of the propagation of elastic surface wave, with respect to the center of the output IDT.

The drawbacks of the above described elastic surface wave filter will be further described through the reference to concrete examples.

In a color television receiver, even if the conventional IF filters used in the television receiver circuit have a flat group delay characteristic, the receiver circuit as a whole cannot always have a flat group delay characteristic. Such a characteristic deviates especially near the band of chrominance signal. Namely, the group delay characteristic is distorted by the influence of a chrominance signal bandpass filter and a 4.5 MHz trap and therefore some drawbacks such as cross-color disturbance and deterioration in chroma response characteristic are incurred.

Further, it is strongly demanded that such an elastic surface wave filter used as an IF filter in a color television receiver should also have a small size and a low cost, as solid-state devices in other fields should. Under the conventional techniques, however, the size of the device must be increased if the envelope of elastic surface wave is represented as exactly as possible. Unless this problem is solved, the elastic surface wave filter is far from being practically used.

It is therefore one object of this invention to provide an elastic surface wave filter which can be easily reduced in size and has a characteristic for compensating the group delay characteristic of an external circuit so as to cause the overall circuit to have a preferable group delay characteristic.

Another object of this invention is to provide an elastic surface wave filter which can be easily reduced in size and can suppress the influence of the direct wave generated between the input and output IDTs.

Yet another object of this invention is to provide an elastic surface wave filter which can be easily reduced in size and can suppress the influence of undesirable components of elastic surface wave and which has a characteristic for compensating the group delay characteristic of an external circuit.

Therefore, according to this invention, there is provided an elastic surface wave filter comprising: a piezoelectric substrate; a first interdigital transducer including interleaved fingers having first predetermined overlap lengths and first predetermined pitches and serving to convert an electrical signal to an elastic surface wave signal; a propagation path for the elastic surface wave signal from the first interdigital transducer; and a second interdigital transducer including interleaved fingers having second predetermined overlap lengths and second predetermined pitches and serving to convert the elastic surface wave signal having passed the propagation path to an electrical signal, the first and second interdigital transducers and the propagation path being provided on the substrate; in which one of the first and second interdigital transducers has a maximum overlap length at a position thereon farther from the other interdigital transducer than the center thereof is, and overlap lengths and the pitches in the one interdigital transducer vary in an asymmetrical manner with respect to the maximum overlap length position in directions towards and away from the other interdigital transducer.

Other features, objects and advantages of this invention will be apparent when one reads the following description of this invention in conjunction with the attached drawings, in which:

FIG. 1 schematically shows in plan the basic structure of an elastic surface wave filter;

FIG. 2 illustrates the shape and the dimensions of the electrode of split type having figures, used as the input or the output IDT of an elastic surface wave filter;

FIG. 3 schematically shows in plan the structure of a conventional elastic surface wave filter;

Figure 2:
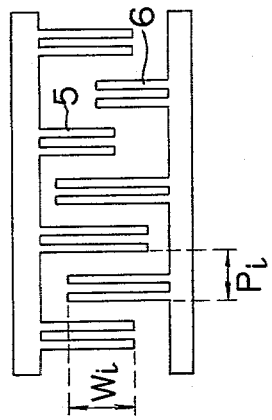
Figure 1:
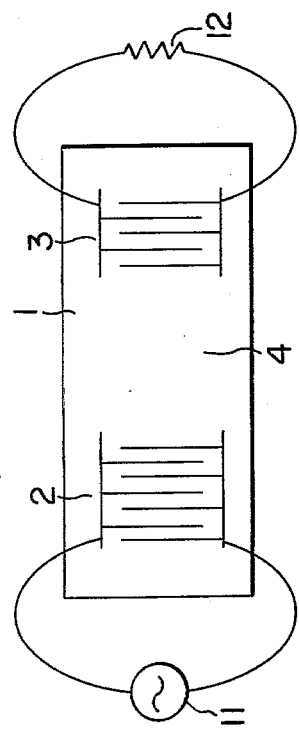

For a better understanding of this invention, the technical features of the elastic surface wave filter according to this invention will first be described and then the embodiments of the filter will be described in detail through the reference to the attached drawings.

First, concerning the technical features, the Inventors' study and examination has revealed that in case of an IF filter for a color television system a desired characteristic can be obtained by adopting an IDT having such features as follows in which the group delay time near the chrominance signal carrier frequency is advanced relative to that near the center frequency. Namely, (1) The position of the maximum overlap of the overlap weighted (i.e. varied overlap type) IDT lies farther from the other normal (i.e constant overlap type) IDT than the center of the overlap weighted IDT does.

(2) The overlap and the pitch of the overlap weighted IDT vary asymmetrically on both the sides of the position of the maximum overlap.

The feature (1) is necessary since the group delay time near the chrominance signal carrier frequency is advanced in comparison with the group delay time near the center frequency while the feature (2) is essential so as to obtain a desired group delay and amplitude characteristics.

Let the physical interpretation of such features be given to facilitate the understanding of these features. Since the group delay time near the chrominance signal carrier frequency leads the group delay time near the center frequency, the information near the chrominance signal carrier frequency exists nearer to the normal IDT and the information near the center frequency lies farther from the normal IDT, as viewed on the overlap pattern of the overlap weighted IDT.

Also, since the amplitude level near the center frequency is higher than that near the chrominance signal carrier frequency, the overlap length corresponding to the amplitude level near the center frequency is larger.

Therefore, in order that the information near the chrominance signal carrier frequency may be taken in as much as necessary and that a desired characteristic may be obtained with a limited number of pairs of fingers (e.g. 50 pairs of fingers), the number of the pairs of fingers being limited so as to reduce the size of the device, it is necessary to locate the position of the maximum overlap of the overlap weighted IDT farther from the normal IDT than the center of the overlap weighted IDT.

According to the Inventors' study, in order to attain the above objects, the group delay characteristic of an IF filter must have a flat response with a deviation of less than about ±50 n sec for a frequency band from the video carrier frequency $f_p$ to the chrominance signal carrier frequency $f_c+500$ KHz, lead gradually for frequencies lower than $f_c+500$ KHz and have a lead of about several hundreds of n sec at $f_c-500$ KHz, relative to the group delay time for the flat response region. Such a characteristic can hardly be obtained by conventional LC filters. It was, however, revealed by the Inventors that the above characteristic could be realized by the elastic surface wave filter described below. Namely, the Inventors have shown that if the overlap Wi and the pitch Pi are varied asymmetrically the group delay characteristic has an uneven response and that any desired group delay characteristic can be obtained by suitably controlling the overlap Wi and the pitch Pi of the overlap weighted IDT.

Now, this invention will be described in detail by way of embodiment with the aid of the attached drawings.

Figure 3:
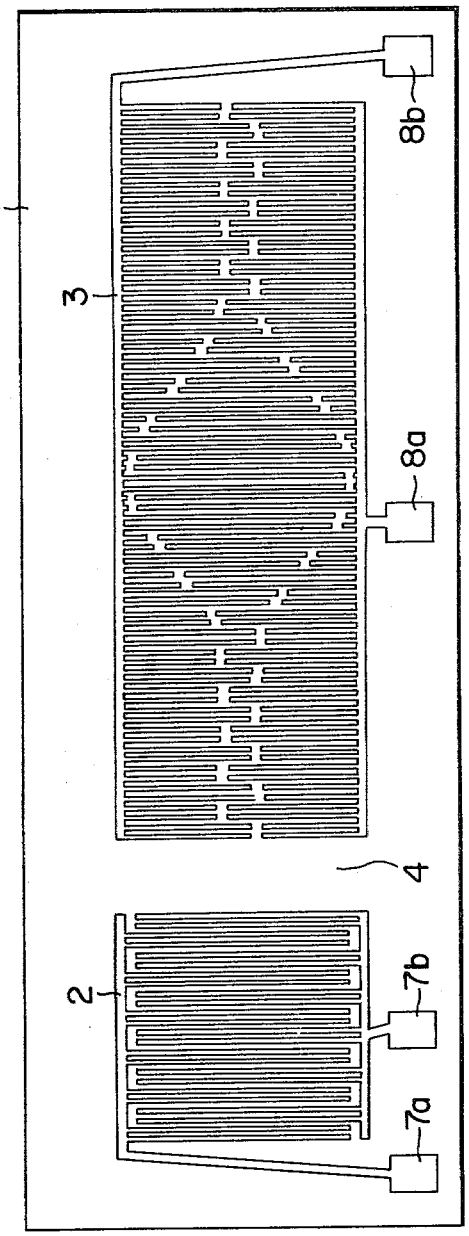
Figure 4:
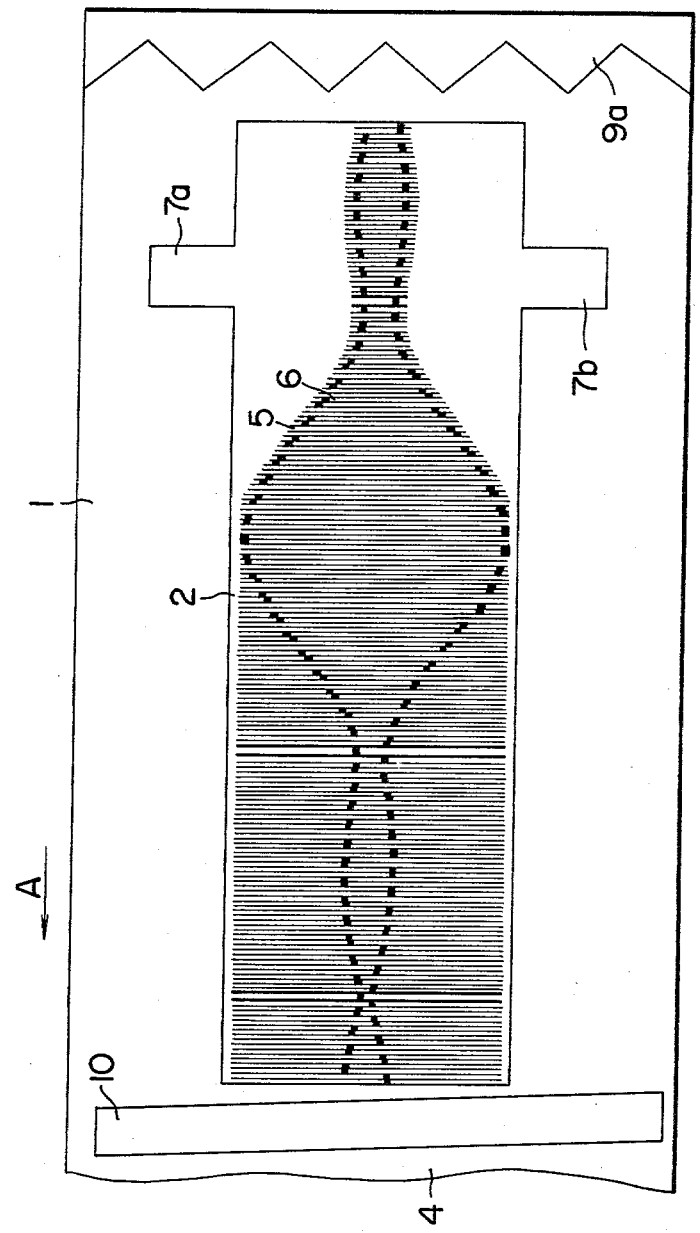
FIG. 4 shows in plan the structure of the input IDT of an elastic surface wave filter as a first embodiment of this invention.

FIG. 4 shows an elastic surface wave filter according to one embodiment of this invention, in which reference numeral 1 indicates a piezoelectric substrate plate of LiNbO₃; 2 an input IDT; 4 a propagation path; 5 and 6 interleaved fingers of the input IDT 2; 7a and 7b electrode terminals; 9a a wave absorber for absorbing unwanted components of the elastic surface wave, provided on that portion of the substrate plate 1 where an active region including the above-mentioned elements 2, 4, 5 and 6 does not exist, e.g., between the neighboring outside of the active region and the border of the substrate plate; and 10 a grounding electrode for preventing the direct wave between the input IDT 2 and the output IDT (not shown). The output IDT, which is to be disposed opposite to the input IDT 2 with respect to the propagation path 4, is of the normal type identical with the conventional example such as shown in FIG. 3 and therefore the figure and the description thereof are omitted. For the facility of understanding, the electrode fingers are drawn white and the black portions in the white background represent the boundary gaps of the opposite fingers 5 and 6. The input IDT fingers are numbered in the order of their nearness to the output IDT.

Figure 5:
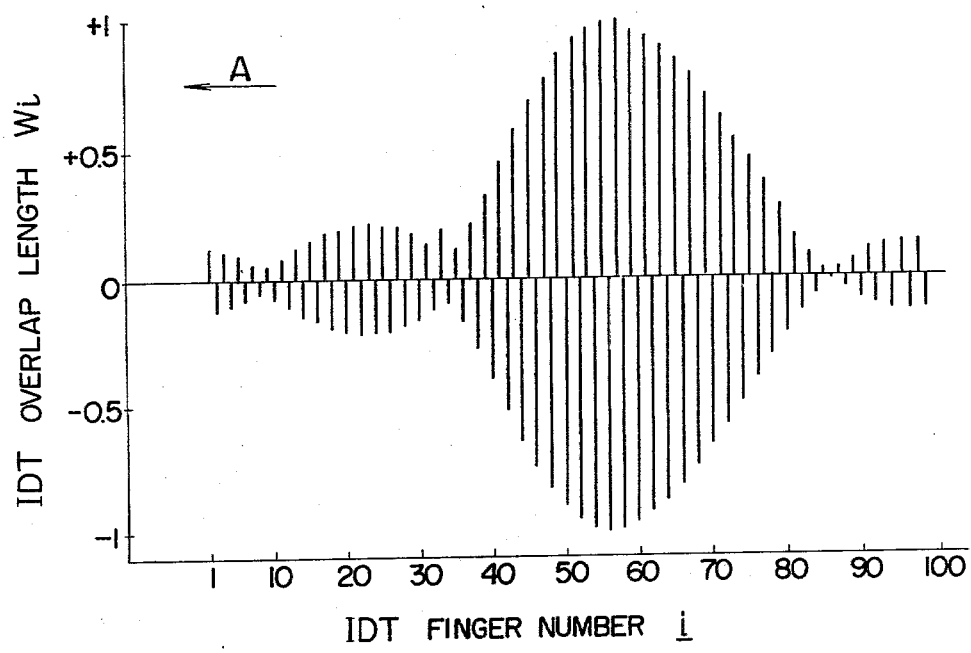
FIG. 5 shows the relationship between the overlap length Wi and the finger number of the input IDT shown in FIG. 4.
Figure 6:
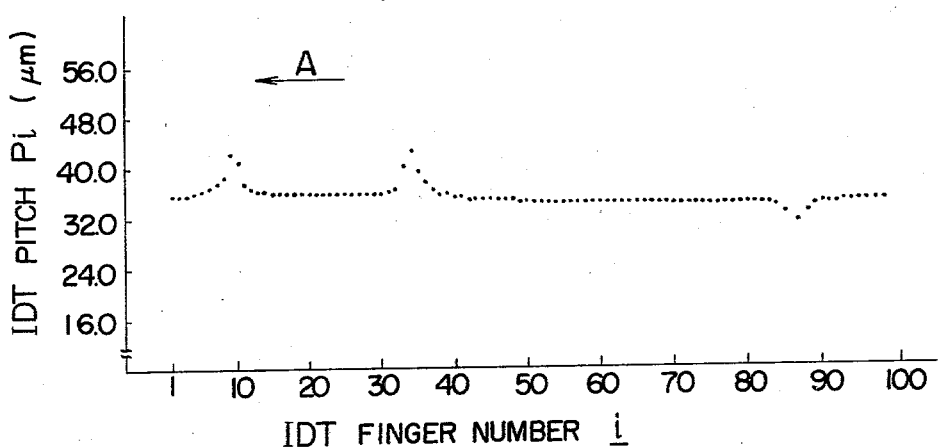
FIG. 6 shows the relationship between the pitch Pi and the finger number of the input IDT shown in FIG. 4.

FIGS. 5 and 6 show in further detail the overlaps Wi and the pitches Pi of the respective fingers of the input IDT 2 having, for example, 98 fingers. The arrow A in FIGS. 5 and 6 points to the place where the output IDT is located. Namely, in an elastic surface wave filter, the output IDT is arranged in a manner described above. The output IDT in the first embodiment is similar in shape to the input IDT shown in FIG. 3, of normal type having constant overlap Wi and constant pitch Pi and having 30 fingers (15 finger pairs).

As seen from FIGS. 5 and 6, especially from FIG. 5, the finger #56 has the maximum overlap length, this being different from the conventional overlap pattern as shown in FIG. 3, in which the central finger #49 has the maximum overlap length. Namely, in this embodiment, the peak of overlap is located farther from the output IDT than the central finger is. It is therefore seen from FIGS. 5 and 6 that the overlap Wi and the pitch Pi are varied asymmetrically with respect to the finger #56 having the maximum overlap. This meets the two requirements mentioned above.

Figure 10:
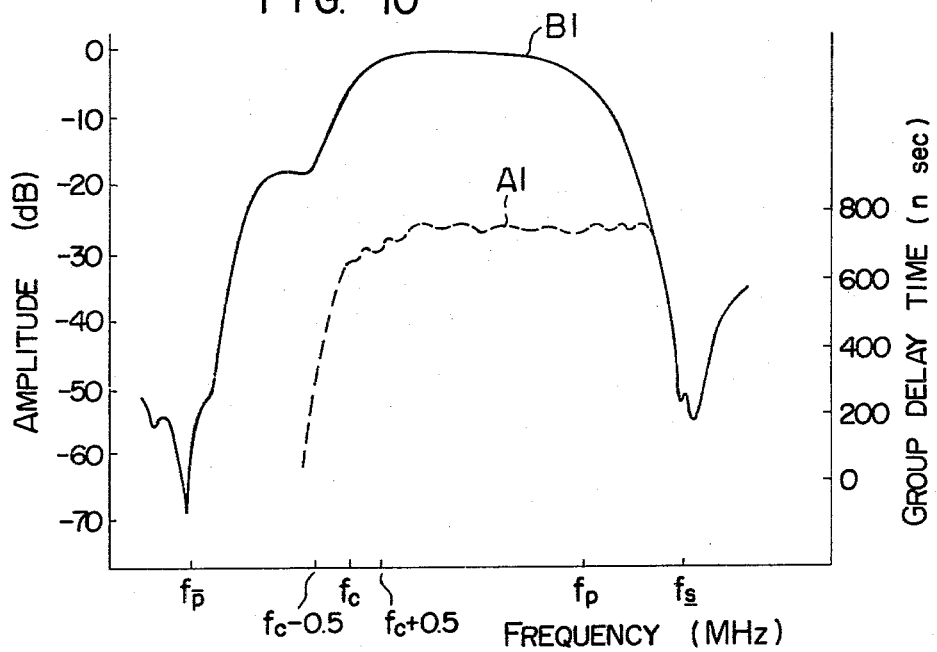
FIG. 10 shows the group delay characteristic and the amplitude characteristic with frequency, of the elastic surface wave filter as the first embodiment of this invention.

FIG. 10 shows the relationships between the group delay time A1 and frequency and between the amplitude B1 and frequency, concerning the elastic surface wave filter as the first embodiment of this invention, comprising the input IDT shown in FIG. 4 (FIG. 5 and FIG. 6) and the output IDT of normal type having 30 fingers (15 finger pairs). As seen from FIG. 10, the group delay characteristic has a preferable, flat response of about 750±50 n sec for a frequency band from the video carrier frequency $f_p$ to $f_c+0.5$ MHz, where $f_c$ is the chrominance signal carrier frequency. The group delay time advances as the frequency falls below the value $f_c+0.5$ MHz, that is, about 650 n sec at the chrominance signal carrier frequency $f_c$ and about 300 n sec at $f_c-0.5$ MHz. The difference between the group delay times at the flat region and at $f_c-0.5$ MHz is about 450 n sec.

The method of fabricating an elastic surface wave filter according to this invention will next be described briefly. The surface of a thin substrate of piezoelectric material is so worked to a so-called mirror face finish that no strain may remain in the surface in a crystallographic sense, and through the well-known vacuum evaporation technique a thin aluminum film (Al) is formed to be used as an input and an output IDTs and further as a grounding electrode if necessary. Portions of the aluminum film are then removed through the well-known photoetching technique so as to form the active region of an elastic surface wave filter having such a pattern as shown in FIG. 4. It is a matter of course that the input and output IDTs are provided through the same techniques with electrode terminals (e.g. 7a and 7b) for electrical connections with external circuits.

Outside the active region of the elastic surface wave filter occupied by the input and output IDTs and the propagation path for elastic surface wave, for example, between the neighboring outside of the active region and the border of the piezoelectric substrate plate is provided a wave absorber or wave absorbing material, if necessary, for preventing the degradations of various characteristics due to the reflection of elastic surface wave. Then, some suitable treatments are applied and finally the structure thus prepared is subjected to hermetical sealing process to attain the resistiveness to the atmosphere to surround the finished electronic device at operation, that is, to improve reliability.

Figure 7:
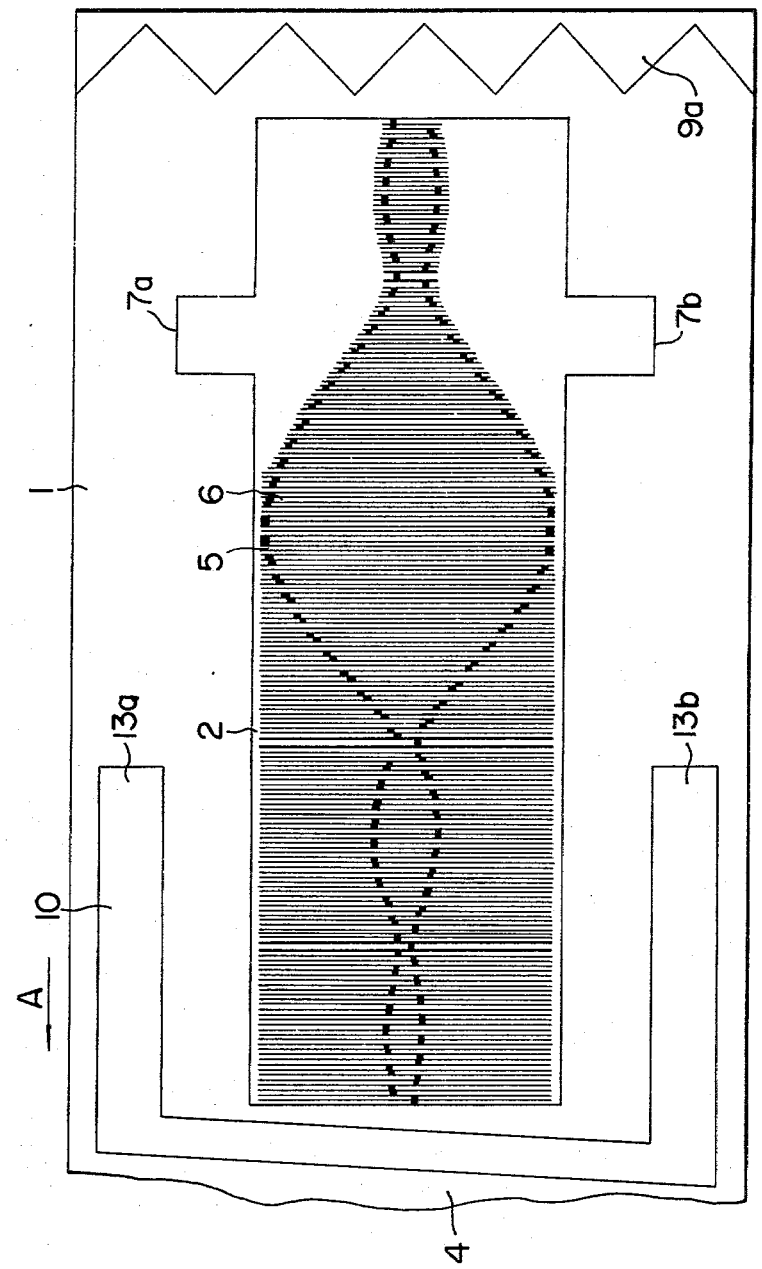
FIG. 7 shows in plan the structure of the input IDT of an elastic surface wave filter as a second embodiment of this invention.

FIG. 7 shows an elastic surface wave filter as a second embodiment of this invention, in which reference numeral 1 indicates a piezoelectric substrate plate of LiNbO$_3$; 2 an input IDT; 4 a propagation path; 5 and 6 fingers of the input IDT 2; 7a and 7b electrode terminals; 9a a wave absorbing member for absorbing the unwanted components of elastic surface wave; 10 a U-shaped grounding electrode for preventing the direct wave between the input IDT 2 and the output IDT (not shown); and 13a and 13b electrode terminals of the grounding electrode. The output IDT, which is disposed opposite to the input IDT 2 with respect to the propagation path 4, is of normal type identical with that shown in FIG. 3 and therefore not shown and not described again.

The structural differences of the input IDT shown in FIG. 7 from that shown in FIG. 4 are as follows. First, the position of the maximum overlap, and the distributions of the overlap Wi and the pitch Pi are different. Secondly, the grounding electrode 10 has the shape of a staple or is U-shaped, receiving one end of the input IDT. And thirdly, the electrode terminals 13a and 13b are provided at the extreme ends of the grounding electrode 10.

This elastic surface wave filter shown in FIG. 7 can also be fabricated by the same method as described above concerning the filter shown in FIG. 4.

Figure 8:
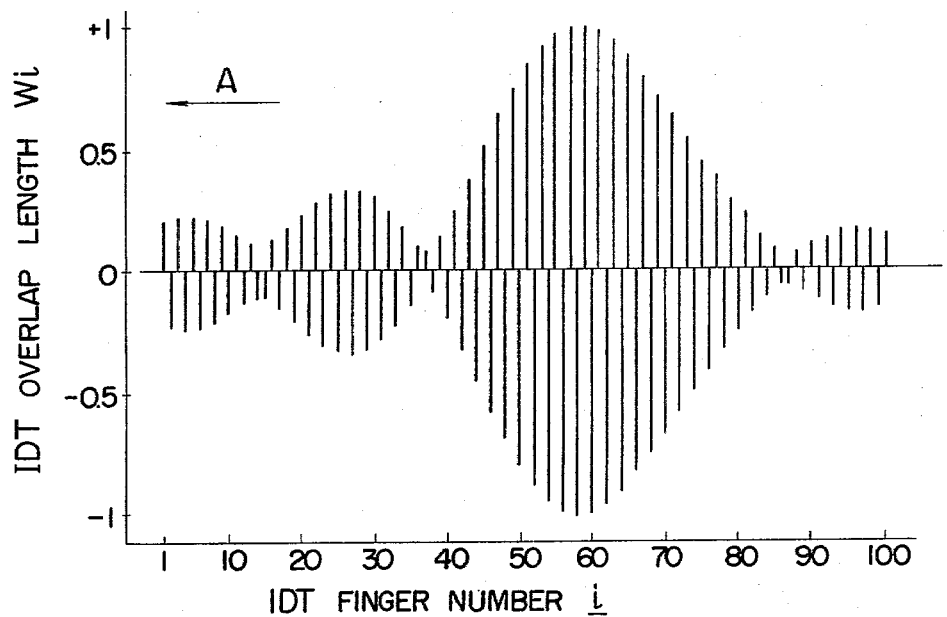
FIG. 8 shows the relationship between the overlap length Wi and the finger number of the input IDT shown in FIG. 7.
Figure 9:
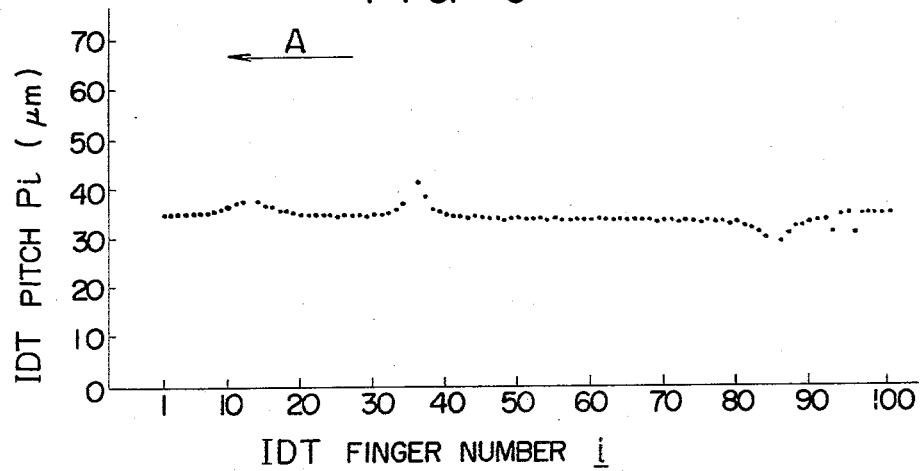
FIG. 9 shows the relationship between the pitch Pi and the finger number of the input IDT shown in FIG. 7.

FIGS. 8 and 9 show respectively the overlap lengths Wi and the pitches Pi of the individual fingers of the input IDT shown in FIG. 7, the abscissae of the rectangular coordinate systems in FIGS. 8 and 9 representing finger numbers. The input IDT has 98 fingers (49 finger pairs). The arrow A in these figures points to the place where the output IDT (not shown) is located. The output IDT is thus arranged in an elastic surface wave filter in such a manner as described above. The output IDT used in the second embodiment of this invention also has 30 fingers (15 finger pairs) and is of normal type, similar to that shown in FIG. 3, having constant overlap Wi and constant pitch Pi.

As apparent from FIGS. 8 and 9, especially from FIG. 8, the finger #58 has the maximum overlap length, this being different from the conventional overlap pattern as shown in FIG. 3, in which the central finger #49 has the maximum overlap length. Namely, in this embodiment, the position of the maximum overlap is located farther from the output IDT than the center of the input IDT is. It is therefore seen from FIGS. 8 and 9 that the overlap Wi and the pitch Pi are varied asymmetrically with respect to the finger #58 having the maximum overlap. This meets the two requirements mentioned above.

Figure 11:
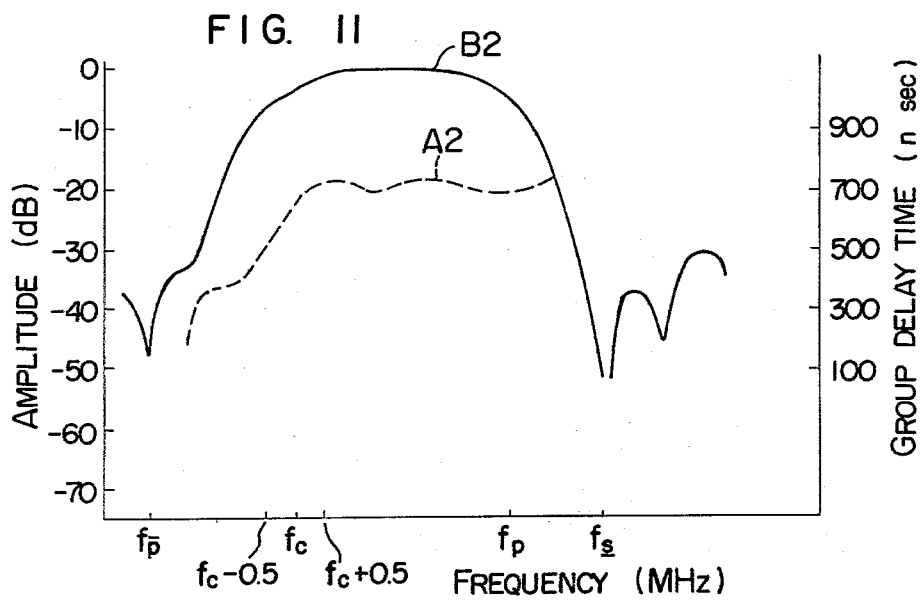
FIG. 11 shows the group delay characteristic and the amplitude characteristic with frequency, of the elastic surface wave filter as the second embodiment of this invention.

FIG. 11 shows the relationships between the group delay time A2 and frequency and between the amplitude B2 and frequency, concerning the elastic surface wave filter as the second embodiment of this invention, comprising the input IDT shown in FIG. 7 (FIGS. 8 and 9) and the output IDT of normal type having 30 fingers (15 finger pairs).

As seen from FIG. 11, the group delay characteristic has a preferable, flat response of about 680±50 n sec for a frequency band from the video carrier frequency f$_p$ to f$_c$+0.5 MHz, where f$_c$ is the chrominance signal carrier frequency. The group delay time advances as the frequency falls below the value of f$_c$+0.5 MHz, that is, about 650 n sec at the chrominance signal carrier frequency f$_c$ and about 510 n sec at f$_c$−0.5 MHz. The difference between the group delay times at the flat region and at f$_c$−0.5 MHz is about 170 n sec.

The comparative examination of FIGS. 10 and 11 shows that the advance of the group delay time in the frequency band from f$_c$−0.5 MHz to the chrominance signal carrier frequency f$_c$ is steeper in FIG. 10 than in FIG. 11 and that the degree of asymmetry of the amplitude characteristic is greater in FIG. 10 than in FIG. 11, the amplitude characteristic in FIG. 11 assuming a quasi-symmetry for a rather broad frequency band.

It is clear that the above described differences in the group delay characteristic and the amplitude characteristic are caused by controlling the position of the maximum overlap and the distributions of the overlap lengths and the pitches of the respective fingers, as described above. It should especially be noted that the advance, i.e. gradient, of the group delay time for the frequency band from f$_c$−0.5 MHz to f$_c$ can be rather widely changed by solely controlling the degree of asymmetry with respect to the position of the maximum overlap if the number of finger pairs is not limited (as in case of a conventional device wherein the size of the piezoelectric substrate plate is not limited), but that the control of the degree of asymmetry alone cannot satisfy the requirement that the size of the piezoelectric substrate plate must be limited to reduce the size of the completed device. Therefore, the very important technical measures lie in that the position of the maximum overlap of one IDT is shifted farther from the other IDT, as described above.

In the above description, the gist of this invention is shown as embodied only in the input IDT, but it is apparent to those skilled in the art that the same result can be obtained even if the gist of the invention is embodied in the output IDT. Such a variation, therefore, will fall within the scope of this invention.

Moreover, the degree of the advance of the group delay time can be arbitrarily changed by changing the overlap lengths and the pitches of the fingers of the IDT.

Further, besides lithium niobate LiNbO$_3$, lithium tantalate LiTaO$_3$, tellurium oxide TeO$_2$, quartz SiO$_2$, or bismuth germanate (BGO; Bi$_{12}$GeO$_{20}$) can be used as a piezoelectric single crystal substrate. Lead zircotitanate ceramics (PZT), barium titanate ceramics (BaTiO$_3$) or lead titanate ceramics (PbTiO$_3$) can be used as piezoelectric ceramics. Zinc oxide (ZnO), zirconium oxide (ZrO$_2$), cadmium oxide (CdS) or the like can be used as piezoelectric thin films.

As apparent from the foregoing description, by using elastic surface wave filters according to this invention as IF filters of a color television receiver, a characteristic which compensates for the group delay characteristic of an external circuit can be easily obtained. In addition to this, the elastic surface wave filters used as IF filters are smaller in size than the conventional LC filter and moreover does not need any adjusting operation.

What we claim is:

1. An elastic surface wave filter comprising: a piezoelectric substrate plate; a first interdigital transducer including interleaved fingers having first predetermined overlap lengths and first predetermined pitches and serving to convert an electrical signal to an elastic surface wave signal; a propagation path for the elastic surface wave signal from said first interdigital transducer; and a second interdigital transducer including interleaved fingers having second predetermined overlap lengths and second predetermined pitches and serving to convert the elastic surface wave signal having passed said propagation path to an electrical signal, said first and second interdigital transducers and said propagation path being provided on said substrate plate; in which one of said first and second interdigital transducers has a maximum overlap length at a position thereon farther from the other interdigital transducer than the center thereof is, and the overlap lengths and the pitches in said one interdigital transducer vary in an asymmetrical manner with respect to said maximum overlap length position in directions towards and away from the other interdigital transducer.

2. An elastic surface wave filter as described in claim 1, wherein the elastic surface wave filter is part of a television receiver, and the position of the maximum overlap length and the asymmetrical varying of the overlap and pitch about this maximum overlap position are set to provide an uneven response for the group delay characteristic of the elastic surface wave filter to compensate for distortions caused to the group delay characteristic by a chrominance signal bandpass filter of the television receiver.

3. An elastic surface wave filter as described in claim 2, wherein the position of the maximum overlap length and the asymmetrical varying of the overlap and pitch about this maximum overlap position are set so that the group delay time of the elastic surface wave filter is less at the chrominance signal carrier frequency Fc than at the video carrier frequency Fp.

4. An elastic surface wave filter as described in claim 3, wherein the position of the maximum overlap length and the asymmetrical varying of the overlap and pitch about this maximum overlap position are set so that the group delay time of the elastic surface wave filter decreases at frequencies below the chrominance signal carrier frequency Fc.

5. An elastic surface wave filter comprising: a piezoelectric substrate plate; an active region which includes a first interdigital transducer including interleaved fingers having first predetermined overlap lengths and first predetermined pitches and serving to convert an electrical signal to an elastic surface wave signal, a propagation path for the elastic surface wave signal from said first interdigital transducer, and a second interdigital transducer including interleaved fingers having second predetermined overlap lengths and second predetermined pitches and serving to convert the elastic surface wave signal having passed said propagation path to an electrical signal; and means for absorbing unwanted waves contained in said elastic surface wave signal, said active region and said absorbing means being provided on said substrate plate; in which one of said first and second interdigital transducers has a maximum overlap length at a position thereon farther from the other interdigital transducer than the center thereof is, and the overlap lengths and the pitches in said one interdigital transducer vary in an asymmetrical manner with respect to said maximum overlap length position in directions towards and away from the other interdigital transducer, and said absorbing means is provided on that portion of the substrate plate where said active region does not exist.

6. An elastic surface wave filter as described in claim 5, in which said absorbing means is provided between the neighboring outside of said active region and the boarder of said piezoelectric substrate plate.

7. An elastic surface wave filter comprising: a piezoelectric substrate plate; a first interdigital transducer including interleaved fingers having first predetermined overlap lengths and first predetermined pitches and serving to convert an electrical signal to an elastic surface wave signal; a propagation path for the elastic surface wave signal from said first interdigital transducer; a second interdigital transducer including interleaved fingers having second predetermined overlap lengths and second predetermined pitches and serving to convert the elastic surface wave signal having passed said propagation path to an electrical signal; and a grounding electrode, said first and second interdigital transducers, said propagation path and said grounding electrode being provided on said substrate plate; in which one of said first and second interdigital transducers has a maximum overlap length at a position thereon farther from the other interdigital transducer than the center thereof is, and the overlap lengths and the pitches in said one interdigital transducer vary in an asymmetrical manner with respect to said maximum overlap length position in directions towards and away from the other interdigital transducer, and said grounding electrode is disposed between said first and second interdigital transducers and extends to traverse said propagation path.

8. An elastic surface wave filter as described in claim 7, in which said grounding electrode is constituted by a rectangular thin metal film.

9. An elastic surface wave filter as described in claim 7, in which said grounding electrode is constituted by an almost U-shaped thin metal film.

10. An elastic surface wave filter comprising: a piezoelectric substrate plate; an active region which includes a first interdigital transducer including interleaved fingers having first predetermined overlap lengths and first predetermined pitches and serving to convert an electrical signal to an elastic surface wave signal, a propagation path for the elastic surface wave signal from said first interdigital transducer, and a second interdigital transducer including interleaved fingers having second predetermined overlap lengths and second predetermined pitches and a serving to convert the elastic surface wave signal having passed said propagation path to an electrical signal; means for absorbing unwanted waves contained in said elastic surface wave signal; and a grounding electrode, said active region, said absorbing means and said grounding electrode being provided on said substrate plate; in which one of said first and second interdigital transducer has a maximum overlap length at a position thereon farther from the other interdigital transducer than the center thereof is, and the overlap lengths and the pitches in said one interdigital transducer vary in an asymmetrical manner with respect to said maximum overlap length position in directions towards and away from the other interdigital transducer, and said absorbing means is provided on that portion of the substrate plate where said active region does not exist, and said grounding electrode is disposed between said first and second interdigital transducers and extends to traverse said propagation path.

* * * * *